United States Patent
Seeger et al.

(10) Patent No.: US 12,170,869 B2
(45) Date of Patent: Dec. 17, 2024

(54) FIXED-FIXED MEMBRANE FOR MICROELECTROMECHANICAL SYSTEM MICROPHONE

(71) Applicant: INVENSENSE, INC., San Jose, CA (US)

(72) Inventors: Joseph Seeger, Menlo Park, CA (US); Sushil Bharatan, Burlington, MA (US); Andrew Randles, Abington, MA (US); Michael John Foster, Groton, MA (US)

(73) Assignee: INVENSENSE, INC., San Jose, CA (US)

( * ) Notice: Subject to any disclaimer, the term of this patent is extended or adjusted under 35 U.S.C. 154(b) by 101 days.

(21) Appl. No.: 17/931,783

(22) Filed: Sep. 13, 2022

(65) Prior Publication Data
US 2024/0089668 A1 Mar. 14, 2024

(51) Int. Cl.
*H04R 19/04* (2006.01)
*B81B 3/00* (2006.01)

(52) U.S. Cl.
CPC ........... *H04R 19/04* (2013.01); *B81B 3/0072* (2013.01); *B81B 2201/0257* (2013.01); *B81B 2203/0127* (2013.01); *B81B 2203/019* (2013.01); *H04R 2201/003* (2013.01)

(58) Field of Classification Search
CPC .............. H04R 19/04; H04R 2201/003; B81B 3/0072; B81B 2203/0127
See application file for complete search history.

(56) References Cited

U.S. PATENT DOCUMENTS

| | | |
|---|---|---|
| 9,078,069 B2 | 7/2015 | Bharatan et al. |
| 9,462,389 B2 | 10/2016 | Wang |
| 10,250,998 B2 | 4/2019 | Hsieh et al. |
| 10,327,077 B2 | 6/2019 | Yoo |
| 11,388,496 B2 | 7/2022 | Rombach et al. |
| 11,746,001 B2 | 9/2023 | Rombach |
| 2008/0175417 A1 | 7/2008 | Kok et al. |
| 2008/0212409 A1* | 9/2008 | Lutz .................. B81B 3/0072 367/181 |

(Continued)

FOREIGN PATENT DOCUMENTS

| | | |
|---|---|---|
| CN | 111935620 A | 11/2020 |
| EP | 2252077 A1 | 11/2010 |

(Continued)

OTHER PUBLICATIONS

Notice of Allowance mailed Feb. 22, 2024 for U.S. Appl. No. 18/357,784, 28 pages.

(Continued)

*Primary Examiner* — Sunita Joshi
(74) *Attorney, Agent, or Firm* — Amin, Turocy & Watson, LLP

(57) ABSTRACT

The present invention relates to a fixed-fixed membrane for a microelectromechanical system (MEMS) microphone. In one embodiment, a MEMS acoustic sensor includes a substrate; a membrane situated parallel to the substrate; and at least one vent formed into the membrane, wherein the at least one vent is a curved opening in the membrane, and wherein the at least one vent is disposed substantially along a length of the membrane.

20 Claims, 8 Drawing Sheets

(56) References Cited

U.S. PATENT DOCUMENTS

| | | |
|---|---|---|
| 2009/0169035 A1 | 7/2009 | Rombach et al. |
| 2010/0065930 A1 | 3/2010 | Nakatani |
| 2011/0278683 A1 | 11/2011 | Kasai et al. |
| 2015/0358735 A1 | 12/2015 | Klein et al. |
| 2018/0077499 A1* | 3/2018 | Yoo .................. B81B 3/0075 |
| 2018/0115836 A1* | 4/2018 | Hsieh .................. H04R 31/003 |
| 2018/0208455 A1 | 7/2018 | Wang |
| 2018/0222749 A1 | 8/2018 | Dehe |
| 2019/0092624 A1 | 3/2019 | Walther et al. |
| 2019/0124452 A1 | 4/2019 | Hsieh et al. |
| 2019/0127217 A1* | 5/2019 | Cargill .................. H04R 19/04 |
| 2019/0394573 A1* | 12/2019 | Cheng .................. H04R 19/04 |
| 2020/0196065 A1 | 6/2020 | Pedersen et al. |
| 2020/0290864 A1 | 9/2020 | Fueldner et al. |
| 2021/0067882 A1 | 3/2021 | Rombach |
| 2022/0070568 A1 | 3/2022 | Tang et al. |
| 2023/0118429 A1 | 4/2023 | Rombach et al. |
| 2023/0356998 A1 | 11/2023 | Rombach et al. |

FOREIGN PATENT DOCUMENTS

| | | |
|---|---|---|
| WO | 2014/159552 A1 | 10/2014 |
| WO | 2021226268 | 11/2021 |

OTHER PUBLICATIONS

Invitation to Pay Additional Fees for International Application No. PCT/US2022/043704 dated Jun. 1, 2023.

International Search Report and Written Opinion for International Application No. PCT/US2022/043704 dated Jul. 24, 2023.

Non-Final Office Action received for U.S. Appl. No. 17/308,340, dated Dec. 30, 2022, 18 pages.

Notice of Allowance received for U.S. Appl. No. 17/308,340, dated Apr. 26, 2023, 19 pages.

International Search Report and Written Opinion received for International Application No. PCT/US2021/030938 dated Jul. 26, 2021, 17 pages.

International Search Report and Written Opinion for International Application No. PCT/US2023/035597 dated Jan. 30, 2024.

* cited by examiner

FIXED-FIXED MEMBRANE FOR MICROELECTROMECHANICAL SYSTEM MICROPHONE

TECHNICAL FIELD

The subject disclosure generally relates to microelectromechanical system (MEMS) devices, and more particularly to MEMS microphones.

BACKGROUND

MEMS condenser microphones typically have a diaphragm that forms a variable capacitor with an underlying backplate. Receipt of an audible signal causes the diaphragm to vibrate, consequently generating a variable capacitance signal representing the audible signal. It is this variable capacitance signal that can be amplified, recorded, or otherwise transmitted to another electronic device.

The diaphragm of a MEMS microphone is generally constructed as a membrane consisting of one or more layers. This membrane is typically tensioned and fully clamped, e.g., to the backplate. However, tensioned and fully clamped membranes can exhibit undesirable stiffness, e.g., such that the membrane has low compliance and low average to maximum deflection. This, in turn, can lead to lower than desired sensitivity. It is therefore desirable to implement techniques to improve the sensitivity of MEMS microphones.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1A:
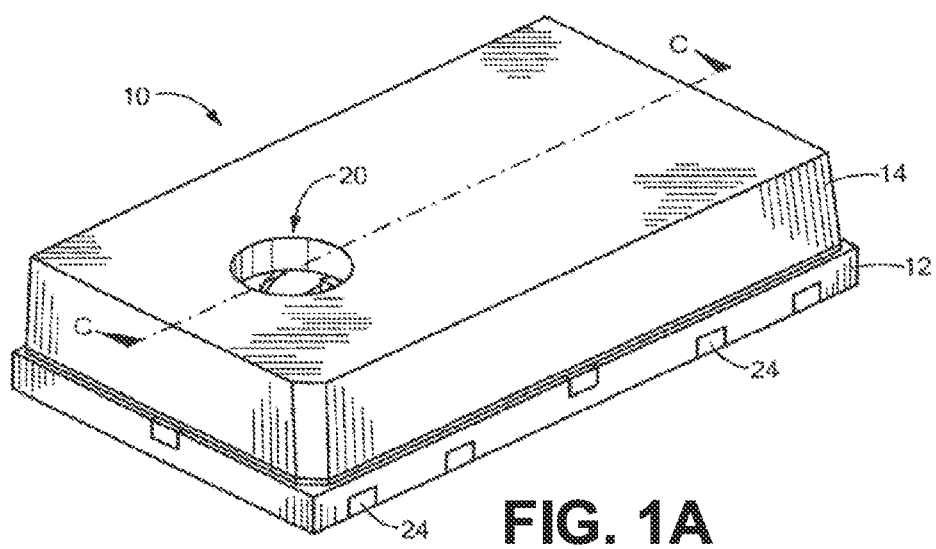
FIG. 1A is a diagram depicting a top perspective view of a packaged microphone having a MEMS microphone die configured in accordance with various embodiments of the disclosure.

One or more aspects of the present disclosure are generally directed toward MEMS microphones and corresponding methods of use. By way of example, a MEMS microphone as described herein can utilize a tensioned "fixed-fixed" membrane. As used herein, "fixed-fixed" refers to a membrane that is affixed to a substrate on opposite ends or sides without the use of springs or a fully clamped design. By way of another example, a MEMS microphone as described herein can utilize a curved vent slit that causes a width of the membrane to be narrower at its center relative to the fixed ends of the membrane, which can eliminate and/or reduce wrinkling of the membrane.

By utilizing a fixed-fixed membrane as described herein, various advantages that improve the performance of a MEMS microphone can be realized. These advantages can include, but are not limited to, the following. Higher microphone sensitivity can be achieved as compared to fully clamped designs, e.g., due to higher average deflection. A membrane as described herein can be constructed using a larger variety of shapes, aspect ratio die sizes, etc., as compared to existing membranes. Clamping can be increased compared to spring based designs, resulting in higher robustness. The length of the membrane can be defined by vents and not the undercut of oxide and/or other sacrificial material in the sense gap between the membrane and backplate, reducing the impact of process variation. An elliptically curved vent shape having a beam width less at the center than at the edge can be used, reducing and/or eliminating wrinkling of the membrane. Other advantages are also possible.

In one aspect disclosed herein, a MEMS acoustic sensor includes a substrate, a membrane situated parallel to the substrate, and at least one vent formed into the membrane. The at least one vent can be a curved and substantially linear opening in the membrane, and the at least one vent can be disposed substantially along a length of the membrane.

In another aspect disclosed herein, another MEMS acoustic sensor can include a substrate and a membrane of a polygonal shape attached to the substrate at respective edges of the membrane. The membrane can have at least one vent, which can be a curved and substantially linear opening in the membrane.

In an additional aspect disclosed herein, a membrane for a MEMS microphone can include a first membrane portion configured to deflect in response to receiving an acoustic signal. The membrane can further include a second membrane portion configured to be attached to a substrate. The membrane can also include a third membrane portion having at least one vent, where each of the at least one vent is a curved through hole in the third membrane portion. Each of the at least one vent can have respective substantially elliptical holes positioned at respective ends of each of the at least one vent, and the membrane can have a rectangular shape.

Other embodiments and various examples, scenarios and implementations are described in more detail below. The following description and the drawings set forth certain illustrative embodiments of the specification. These embodiments are indicative, however, of but a few of the various ways in which the principles of the specification may be employed. Other advantages and novel features of the embodiments described will become apparent from the following description when considered in conjunction with the drawings.

With reference now to the drawings, various views of example MEMS microphone components are provided. It is noted that the drawings are not drawn to scale, either within a single drawing or between different drawings.

FIG. 1A schematically shows a top perspective view of a packaged microphone 10 that may incorporate a MEMS microphone die 16 (shown in FIGS. 1C, 1D, and others discussed below) configured in accordance with various embodiments of the disclosure. In a corresponding manner, FIG. 1B schematically shows a bottom perspective view of the same packaged microphone 10.

The packaged microphone 10 shown in FIGS. 1A-1B has a package base 12 that, together with a corresponding lid 14, forms an interior chamber containing a microphone chip 16 and, if desired, a separate microphone circuit chip 18 (both dies 16 and 18 are shown schematically in FIGS. 1C and 1D and discussed below). The lid 14 in this embodiment is a cavity-type lid, which has four walls extending generally orthogonally from a top, interior face to form a cavity. In an embodiment, the lid 14 is formed from metal or other conductive material to shield the microphone die 16 from electromagnetic interference. The lid 14 secures to the top face of the substantially flat package base 12 to form the interior chamber.

The lid 14 also has an audio input port 20 that enables ingress of audio signals into the chamber. In alternative embodiments, however, the audio port 20 is at another location, such as through the package base 12, or through one of the side walls of the lid 14. Audio signals entering the interior chamber interact with the microphone chip 16 to produce an electrical signal that, with additional (exterior) components (e.g., a speaker and accompanying circuitry), produce an output audible signal corresponding to the input audible signal.

Figure 1B:
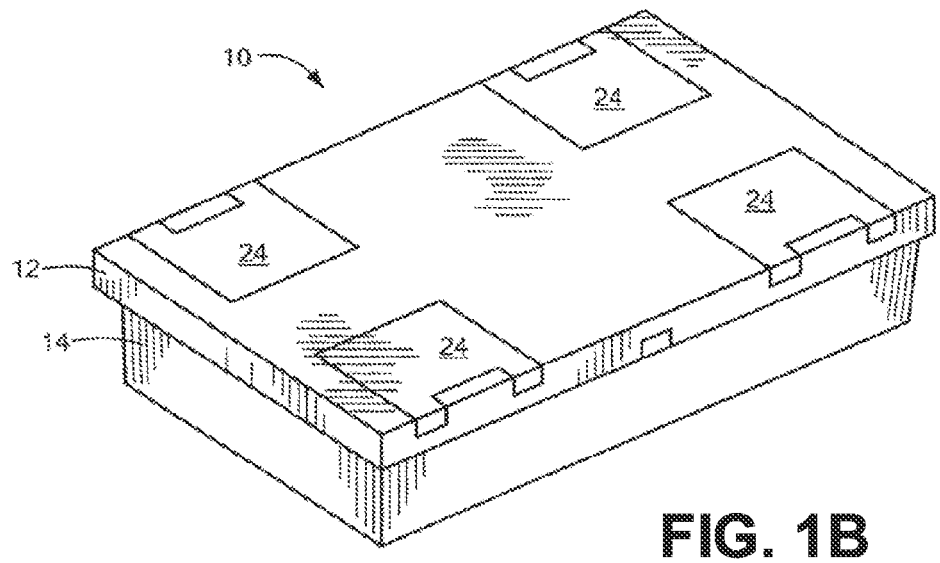
FIG. 1B is a diagram depicting a bottom perspective view of the packaged microphone shown in FIG. 1A.

FIG. 1B shows the bottom face 22 of the package base 12, which has a number of contacts 24 for electrically (and physically, in some implementations) connecting the microphone die 16 with a substrate, such as a printed circuit board or other electrical interconnect apparatus. The packaged microphone 10 may be used in any of a wide variety of applications. For example, the packaged microphone 10 may be used with mobile telephones, land-line telephones, computer devices, video games, hearing aids, hearing instruments, biometric security systems, two-way radios, public announcement systems, and other devices that transduce signals. Additionally, it is anticipated that the packaged microphone 10 could be used as a speaker to produce audible signals from electronic signals.

In some embodiments, the package base 12 shown in FIGS. 1A and 1B may be a printed circuit board material, such as FR-4, or a pre-molded, lead-frame-type package (also referred to as a "pre-molded package"). Other embodiments may use different package types, such as ceramic cavity packages. Accordingly, discussion of a specific type of package is for illustrative purposes only.

Figure 1C:
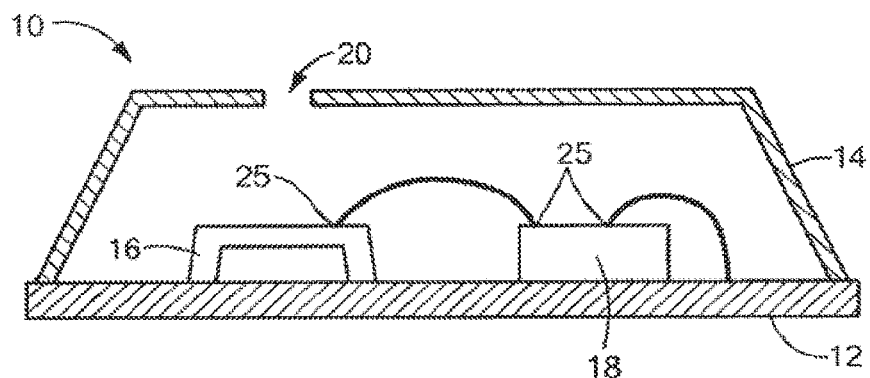
FIG. 1C is a diagram depicting a cross-sectional view of the packaged microphone oriented as shown in FIG. 1A.
Figure 1D:
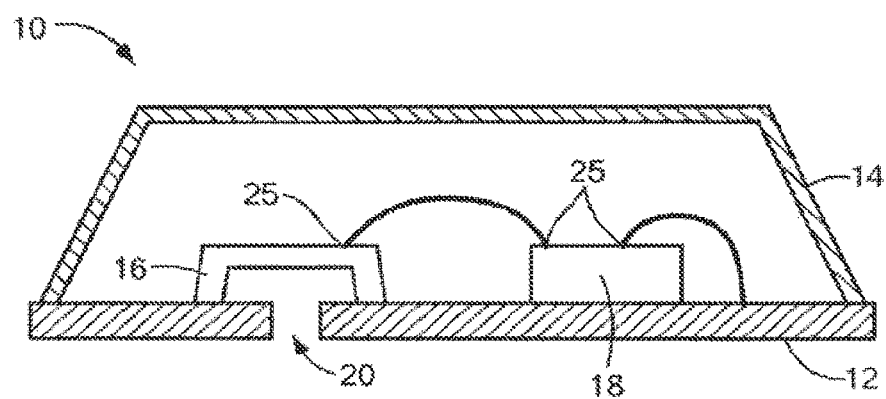
FIG. 1D is a diagram depicting a cross-sectional view of a similar packaged microphone having a bottom port.

FIG. 1C schematically shows a cross-sectional view of the packaged microphone 10 across line C-C of FIG. 1A. As shown and noted above, the lid 14 and base 12 form the noted internal chamber for containing a MEMS microphone die 16 and electronics 18 used to control and drive the microphone die 16. In illustrative embodiments, electronics are implemented as a second, stand-alone integrated circuit, such as an application specific integrated circuit (ASIC) 18. Other embodiments, however, may form the MEMS microstructure and electronic circuitry on a single die.

Adhesive or another fastening mechanism secures both the microphone die 16 and ASIC die 18 to the base 12. Wirebonds electrically connect the microphone die 16 and ASIC die 18 to contact pads (not shown) on the interior of the package base 12, as well as to each other.

While FIGS. 1A-1C show a top port packaged microphone design, Some embodiments position the input port at other locations, such as through the base 12. For example, FIG. 1D schematically shows a cross-sectional view of a similar packaged microphone 10 where the microphone die 16 covers the input port, consequently producing a large back volume. Other embodiments, not shown, position the microphone die 16 so that it does not cover the input port 20 through the base 12.

Discussion of a specific packaged microphone is for illustrative purposes only. Accordingly, the packaged microphone 10 discussed with regard to FIGS. 1A-1D are not intended to limit all embodiments of the disclosure.

Figure 2:
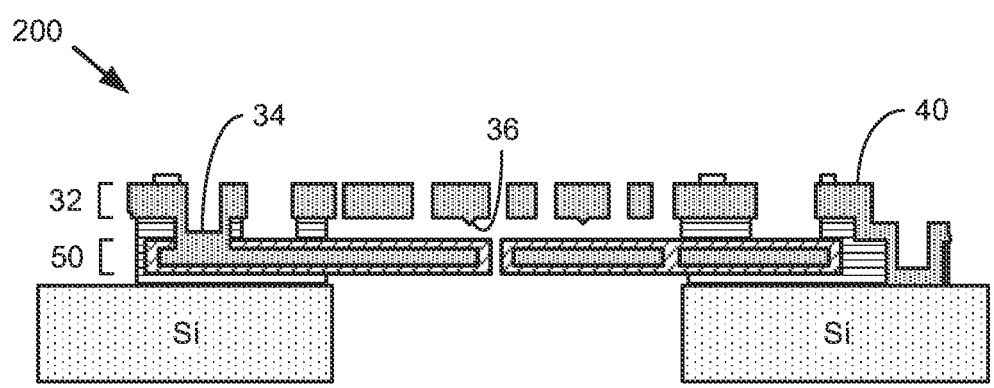
FIG. 2 is a diagram depicting a cross-sectional perspective view of an example MEMS microphone in accordance with various embodiments of the disclosure.

Referring next to FIG. 2, a cross-sectional perspective view of an example MEMS microphone 200 is provided. As shown in FIG. 2, a stationary portion of the microphone 200 has a backplate 32 that, together with a membrane 50, forms a variable capacitor. As known by those skilled in the art, the variable capacitor produces electrical signals representing input acoustic signals incident on the membrane 50. To facilitate operation, the backplate 32 can have a plurality of through-hole apertures (also referred to herein as backplate apertures or simply apertures) that lead to a backside cavity. The apertures may be shaped, sized, and configured to optimize performance.

In an implementation, the membrane 50 shown in FIG. 2 can be deposited onto, and/or otherwise coupled with, other portions of an underlying acoustic sensor, such as the backplate 32, a substrate (e.g., a substrate 60 as will be described below with respect to FIG. 3), or the like. Depending on implementation, a substrate can be positioned on either side of the backplate 32 relative to the membrane 50. Thus, for example, the substrate could be positioned between the backplate 32 and the membrane 50 (forming a membrane-substrate-backplate stack), or alternatively the substrate could be positioned opposite the membrane 50 (forming a membrane-backplate-substrate stack).

The backplate 32 shown in FIG. 2 can be composed, wholly or in part, with polysilicon and/or another conductive material. By utilizing a conductive material in the backplate, electrode patterning (e.g., as described below with respect to FIG. 3) can be performed within the membrane 50 instead of on the backplate 32 and/or other portions of an underlying acoustic sensor. As further shown in FIG. 2, the membrane 50 can be composed of multiple layers, e.g., 3 layers consisting of a conductive layer positioned between two non-conductive (e.g., silicon nitride) layers, with the exception of a contact area 34 between the conductive portions of the backplate 32 and the membrane 50. The membrane 50 and its respective layers are described in further detail below with respect to FIG. 4.

As further shown in FIG. 2, portions of the backplate 32 can have respective dimples 36 or other protrusions expanding outward toward the direction of the membrane 50. In an implementation, a height of the dimples 36 can be determined to meet an mAOP associated with the microphone 200. As further shown in FIG. 2, portions of the backplate 32 and/or the membrane 50 can be attached to a handle (bulk) 40 that is utilized in manufacturing of the microphone 200.

Figure 3:
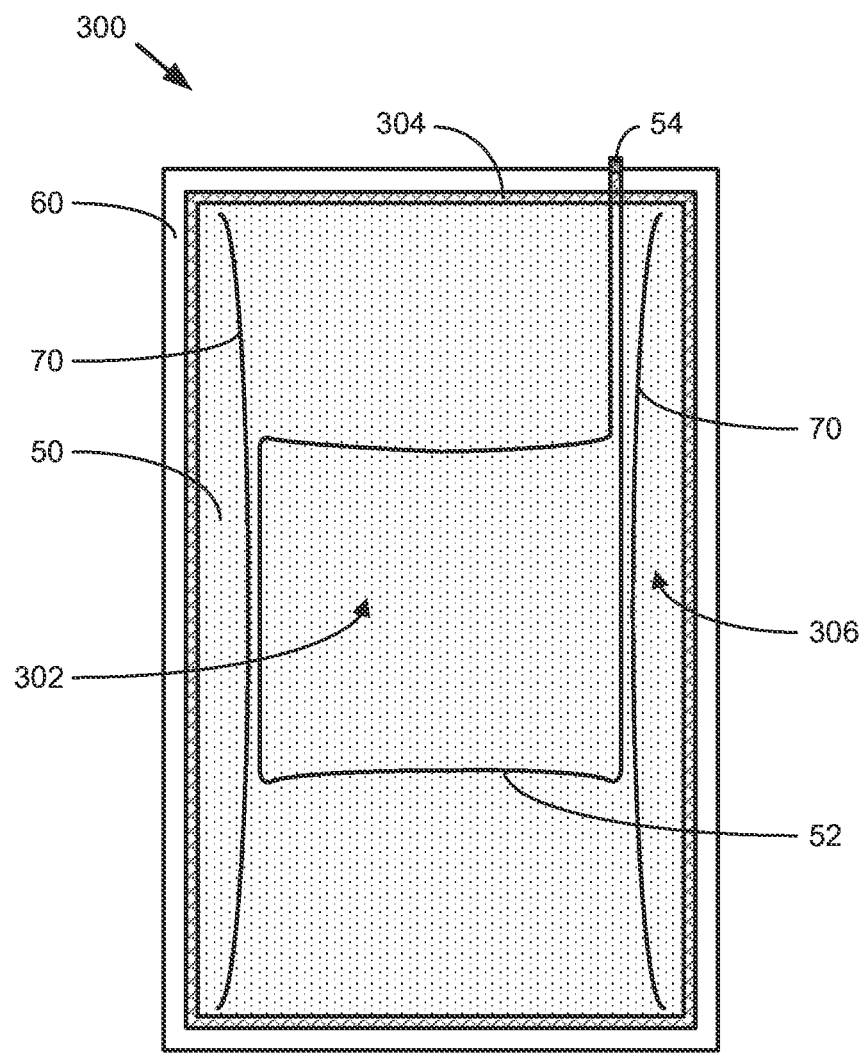
FIG. 3 is a diagram depicting a fixed-fixed membrane for a MEMS microphone in accordance with various embodiments of the disclosure.

Referring next to FIG. 3, a diagram 300 depicting a fixed-fixed membrane 50 for a MEMS acoustic sensor (e.g., a MEMS microphone), also referred to herein as simply a membrane, is provided. Repetitive description of like elements employed in other embodiments described herein is omitted for brevity. With reference to FIG. 3 and the drawings that follow, it is noted that the term "membrane"

is utilized to describe structural elements that are equivalent to the diaphragm 30 described above. It is further noted that the terms "membrane" and "diaphragm," when utilized to describe the corresponding structure, can be based on the operational status of the structure. For instance, the term "membrane" can be used to indicate that the corresponding structure is under tension, while the term "diaphragm" can be used to indicate that the same structure is at rest (i.e., not under tension). It is further noted, however, that in some instances the terms "membrane" and "diaphragm" are used herein interchangeably.

As shown in diagram 300, the membrane 50 is attached to an underlying substrate 60 and/or another suitable device surface. Techniques by which the membrane 50 can be attached to the substrate 60 are described in further detail below. While the membrane 50 shown in diagram 300 is illustrated as being attached to the substrate 60, it is noted that the membrane 50, in some implementations, may not be attached directly to the substrate 60. By way of example, the membrane 50 could be attached to a backplate (e.g., a backplate 32 as described above with respect to FIG. 2) with an optional layer of a spacer material placed between the membrane 50 and the backplate. The backplate, in turn, could then be attached to the substrate 60, with another optional layer of the spacer material placed between the backplate and the substrate 60. Other implementations could also be used.

As further shown in diagram 300, the membrane 50 can have a substantially rectangular shape, i.e., such that a perimeter of the membrane 50 has two longer sides and two shorter sides. Other shapes could also be utilized for the membrane 50, some examples of which are described in further detail below with respect to FIGS. 7A-7C. The membrane 50 can be composed of one or more layers, e.g., as will be described with respect to FIGS. 4-5 below, each of which can be solid and/or have respective holes or other openings (e.g., apertures 38 as described above with respect to FIG. 2) to adjust the low frequency corner of an associated acoustic sensor, to improve airflow through the membrane 50, and/or for other purposes.

The membrane 50 shown in diagram 300 can conceptually be divided into three membrane portions. A first portion 302 of the membrane 50, also referred to herein as a sensing area or an electrode, can be configured to sense deflection of the membrane 50 in response to receiving an acoustic signal, e.g., as described above with respect to FIGS. 1A-1D. As further shown in diagram 300, the perimeter of the electrode 25 is defined by an electrode trench 52 that is embedded into the membrane 50. The electrode trench 52 can additionally be terminated at an electrical contact 54, which can be embedded in and/or otherwise attached to a substrate 60, backplate, and/or other suitable surfaces as will be described in further detail below.

In an embodiment, the electrode 302 can be placed as shown in diagram 300, i.e., substantially in the center of the membrane 50. This can be done, e.g., in order to maximize the distance between the electrode 302 and the edges of the membrane 50, which can in turn result in improved acoustic sensitivity due to higher capacitive variance associated with displacement of the membrane 50 at the area of the electrode 302. As further shown in diagram 300, the electrode 302 can exhibit curvature on one or more sides relative to the edges of the membrane 50, e.g., to follow the displacement contours of the membrane 50 resulting from vents 70 formed into the membrane as will be described below. With respect to the example shown by diagram 300, it is noted that the electrode 302 shown in diagram 300 is for illustrative purposes only and that other electrode shapes and/or sizes could also be implemented.

As further shown in diagram 300, a second portion 304 of the membrane 50 can be configured to attach the membrane 50 to the substrate 60. In an embodiment, the second portion 304 of the membrane 50 can include anchors, adhesives, and/or any other suitable means for permanently attaching the membrane 50 to the substrate 60. In another embodiment, the membrane 50 can be of a size and/or shape such that the second portion 304 of the membrane 50 attaches the edges of the membrane 50 to the substrate 60 while leaving a gap, e.g., an air gap, between the membrane 50 and the substrate 60 at the active area of the membrane 50 in order to facilitate full displacement of the membrane 50 in response to acoustic signals.

In an embodiment as shown by diagram 300, the second portion 304 of the membrane 50 can extend along an entire perimeter of the membrane 50, including all sides of the membrane 50. In an alternative embodiment, the second portion 304 of the membrane 50 could attach the membrane 50 to the substrate 60 on less than all sides of the membrane 50 (e.g., the longer sides, the shorter sides, etc.). In a further alternative embodiment, the second portion 304 of the membrane 50 could be discontinuous along the perimeter of the membrane 50, e.g., such that the membrane 50 is attached to the substrate 60 at discrete points along the perimeter of the membrane 50. Other embodiments are also possible.

As additionally shown in diagram 300, a third portion 306 of the membrane 50 includes at least one vent 70, which are openings that are formed into the third portion 306 of the membrane 50 and disposed substantially along a length of the membrane 50. In the example shown in diagram 300, the membrane 50 has two vents 70, each of which are positioned along respective ones of the longer sides of the membrane 50. It is noted that vents 70 could be positioned relative to the membrane 50 in other ways, e.g., along the shorter sides of the membrane, along all sides of the membrane, etc. Alternative techniques for positioning vents 70 within a rectangular membrane, as well as techniques for positioning vents 70 within a non-rectangular membrane, are described in further detail below with respect to FIGS. 7A-7C.

In the embodiment shown in diagram 300, the vents 70 are curved openings in the membrane 50. In the example shown in diagram 300, the vents 70 are semi-elliptical openings, i.e., openings exhibiting a curved shape that forms a portion of an ellipse. These openings are also positioned such that a major axis of the ellipse corresponding to the shape of the vents 70 is positioned along the sides of the membrane 50.

As a result of the vents 70 shown in diagram 300, the active area of the membrane 50, e.g., the first portion 302 of the membrane 50, is a non-rectangular area having a width at the center of the first portion 302 that is less than a width of the short edges of the membrane 50 to which the first portion 302 is attached. When tension is applied to the short edges of the membrane 50, this results in the first portion 302 of the membrane 50 exhibiting a shape that is similar to that of a hammock, e.g., with the ends of the first portion 302 being pulled apart and the center of the first portion 302 being suspended. Additionally, due to the curvature of the vents 70 shown in diagram 300, wrinkling of the membrane 50 while under tension can be reduced, e.g., as compared to an implementation using straight (non-curved) vents.

By utilizing a membrane 50 with vents 70 as shown in diagram 300, the compliance of the membrane 50 can be improved, which can in turn improve the sensitivity of an underlying acoustic sensor. Additionally, the vents 70 can enable the flow of air from the front of an underlying acoustic sensor to the back, which can be utilized to enable the membrane 50 to function as a microphone as well as to set its corresponding low frequency corner.

Figure 4:
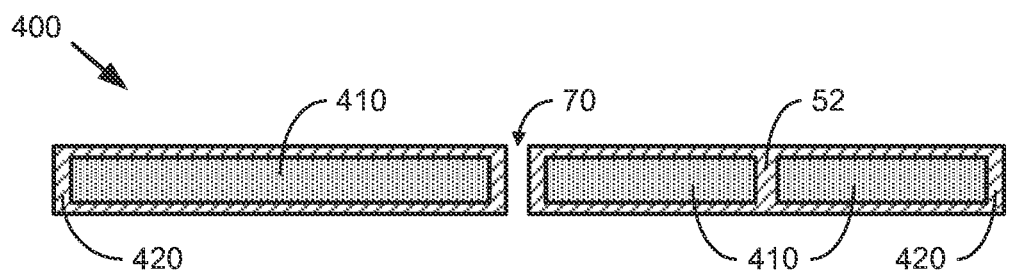
FIG. 4 is a diagram depicting a cross-sectional view of respective layers of a MEMS microphone membrane in accordance with various embodiments of the disclosure.

Referring now to FIG. 4, a diagram depicting a cross-sectional view of respective layers of a MEMS microphone membrane 50, e.g., the membrane 50 shown in FIG. 2, is provided. Repetitive description of like elements employed in other embodiments described herein is omitted for brevity. As shown in FIG. 4, the membrane 50 can generally be composed of three layers, including a conductive layer 410 positioned between two nonconductive layers 420. In one embodiment, the conductive layer 410 can be composed of polysilicon, and the nonconductive layers 420 can be composed of silicon nitride. Other compositions are also possible.

The membrane 50 shown in FIG. 4 can include one or more electrode trenches 52 in which the conductive (polysilicon) layer 410 is removed, leaving only the nonconductive (silicon nitride) layer 420 at the position of the trench 52. This can be done, e.g., to electrically isolate the sensing area of the membrane 50 from a non-sensing area of the membrane 50.

As additionally shown in FIG. 4, a vent 70 formed in the membrane 50 can be a complete opening through the membrane 50, e.g., such that all layers of the membrane 50 are removed at the position of the vent 70. As described above, e.g., with respect to FIG. 3, the complete removal of membrane material at the position of the vent 70 can enable increased compliance of the membrane 50, resulting in improved acoustic sensitivity through increased deflection of the sensing area of the membrane 50.

Figure 5:
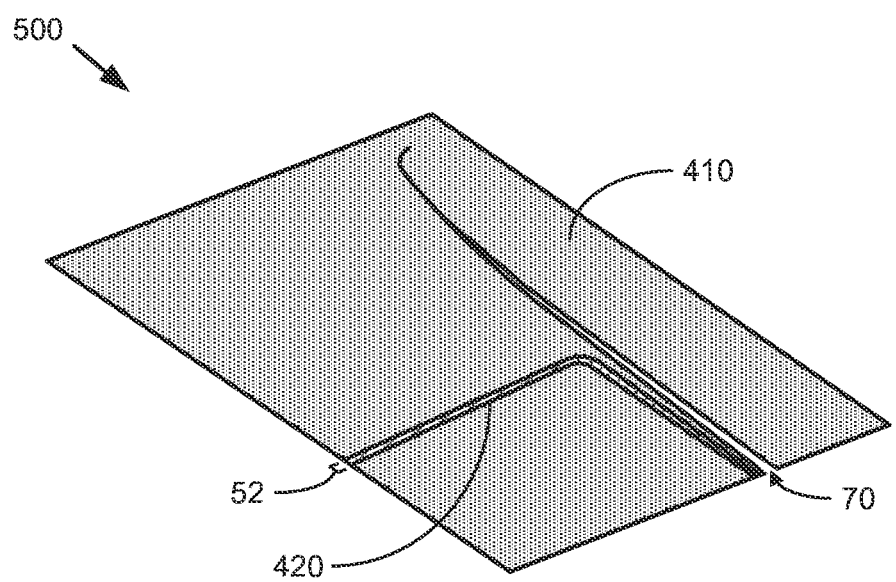
FIG. 5 is a diagram depicting a top perspective view of a quarter portion of the membrane layers shown in FIG. 3.

Diagram 500 in FIG. 5 illustrates a top perspective view of an example membrane having layers similar to those shown by diagram 400 (i.e., conductive layer(s) 410 and nonconductive layer(s) 420) in which the top nonconductive layer 420 has been removed for purposes of illustration. It is noted that diagram 500 shows only a portion of a full membrane, e.g., a quadrant of the membrane, for simplicity of illustration. As shown by diagram 500, areas of the membrane not associated with a vent 70 or an electrode trench 52 have a conductive layer 410 below the top nonconductive layer 420. Diagram 500 further shows that all layers of the membrane are removed at an area of a vent 70, and that material corresponding to the conductive layer 410 is not deposited at an area corresponding to an electrode trench 52, i.e., such that the trench 52 is fully composed of a nonconductive layer 420.

Figure 6:
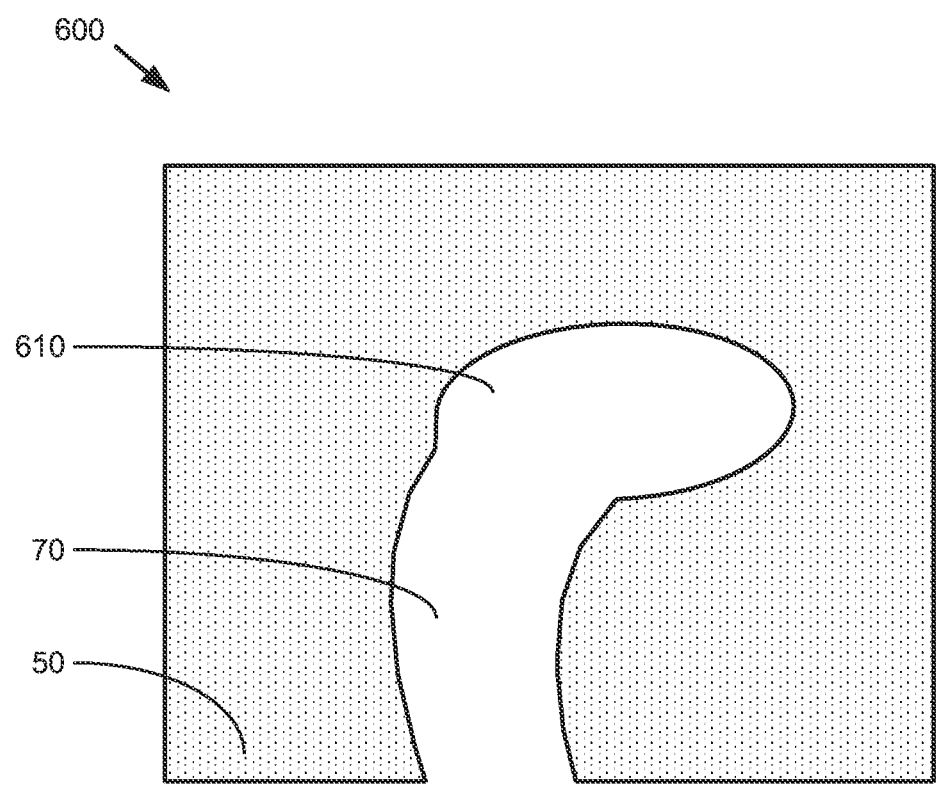
FIG. 6 is a diagram depicting a magnified view of an end of a vent formed into a MEMS microphone membrane in accordance with various embodiments of the disclosure.

Turning next to FIG. 6, a diagram 600 depicting a magnified view of an end 610 of a vent 70 formed into a MEMS microphone membrane 50 is provided. Repetitive description of like elements employed in other embodiments described herein is omitted for brevity. More particularly, diagram 600 shows a magnified view of an end portion of a vent 70 as shown in diagram 300 of FIG. 3. As shown in diagram 600, the vent 70 terminates with a substantially elliptical (circular, elliptical, near elliptical, etc.) hole or opening 610. As further illustrated by diagram 600, the opening 610 can have a diameter (e.g., a major diameter, a minor diameter, etc.) that is larger than a width of the corresponding vent 70, e.g., such that the opening 610 at the end of the vent 70 is wider than the vent 70 itself. By terminating the vent 70 with larger openings 610 as shown in diagram 600, mechanical stress placed upon the end of the vent 70 can be spread over a larger area (e.g., the area of the opening 610), thereby increasing the stress tolerance of the membrane 50.

While diagram 600 illustrates only a single opening 610 for a single vent 70, it is noted that openings 610 as shown in diagram 600 can be placed at respective ends of respective vents 70 formed into a given membrane 50. Thus, for example, the vents 70 shown in diagram 300 could each terminate with an opening 610 as shown in diagram 600 at both ends of said vents 70.

Figure 7A:
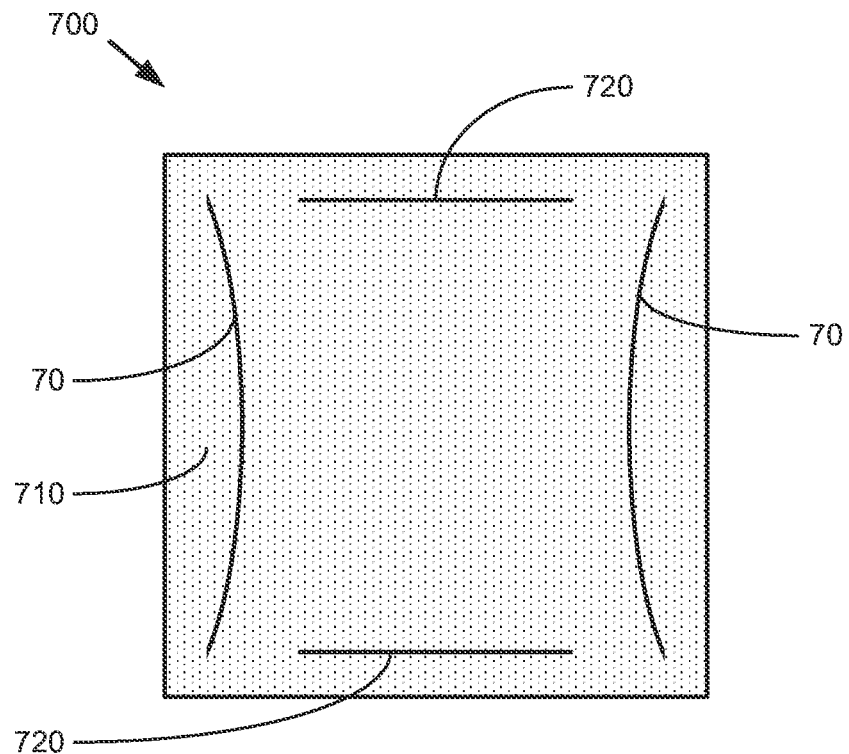
FIGS. 7A-7C are diagrams depicting respective MEMS microphone membrane configurations that can be used in accordance with various embodiments of the disclosure.
Figure 7B:
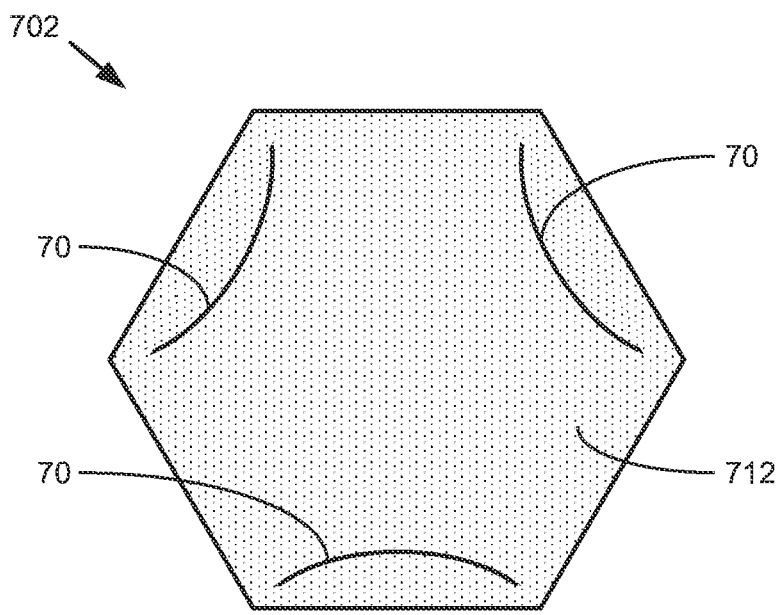
Figure 7C:
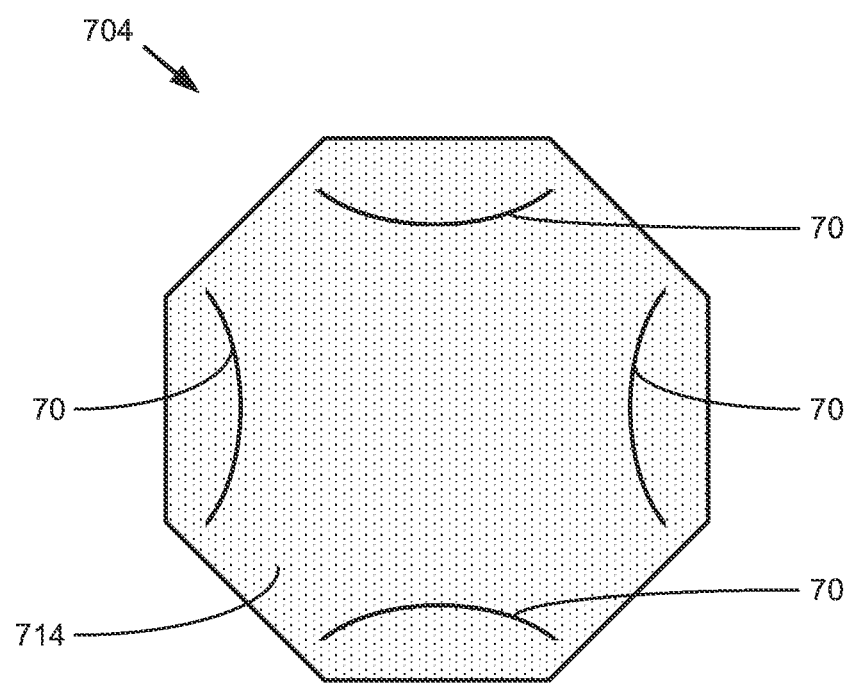

Referring next to FIGS. 7A-7C, diagrams 700, 702, 704 depicting respective MEMS microphone membrane configurations are provided. While various examples described above relate to the specific example of a rectangular membrane, a membrane as described herein can be of any suitable polygonal shape, such as a quadrilateral (e.g., a square, a rectangle, etc.), a hexagon, an octagon, or the like. For instance, in an example shown by diagram 700 in FIG. 7A, a square membrane 710 can be used in which respective curved vents 70 can be disposed along opposite sides of the membrane 710, e.g., as described above for the case of a rectangular membrane. As further shown in diagram 700, additional straight vents 720 can be disposed along the sides of the membrane 710 that are not associated with curved vents 70.

As another example illustrated by diagram 702 in FIG. 7B, a hexagonal membrane 712 can have three curved vents 70 positioned along alternating sides of the membrane 712. Similarly, an octagonal membrane 714 as illustrated by diagram 704 in FIG. 7C can have four curved vents 70 that are similarly positioned along alternating sides of the membrane 714. To generalize, for a polygonal membrane having an even number n of sides, n/2 vents 70 can be formed into the membrane and positioned at alternating sides of the membrane, i.e., every other side of the membrane.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, in the present specification, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should generally be construed to mean "one or more" unless specified otherwise or clear from context to be directed to a singular form.

In addition, the terms "example" and "such as" are utilized herein to mean serving as an instance or illustration. Any embodiment or design described herein as an "example" or referred to in connection with a "such as" clause is not necessarily to be construed as preferred or advantageous over other embodiments or designs. Rather, use of the terms "example" or "such as" is intended to present concepts in a concrete fashion. The terms "first," "second," "third," and so forth, as used in the claims and description, unless otherwise clear by context, is for clarity only and doesn't necessarily indicate or imply any order in time.

What has been described above includes examples of one or more embodiments of the disclosure. It is, of course, not possible to describe every conceivable combination of components or methodologies for purposes of describing these examples, and it can be recognized that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A microelectromechanical system (MEMS) acoustic sensor comprising:
    a substrate;
    a membrane situated parallel to the substrate; and
    at least one vent formed into the membrane, wherein a portion of the at least one vent is a curved opening in the membrane, wherein the at least one vent is disposed substantially along a side of the membrane, wherein at least a portion of the at least one vent is semi-elliptical, and wherein a major axis of the at least one vent is along the side of the membrane.

2. The MEMS acoustic sensor of claim 1, wherein the membrane has a rectangular shape.

3. The MEMS acoustic sensor of claim 2, wherein the at least one vent comprises two vents, wherein the two vents are disposed substantially along respective ones of the two longer sides of the membrane.

4. The MEMS acoustic sensor of claim 2, wherein each side of the membrane is attached to the substrate.

5. The MEMS acoustic sensor of claim 1, wherein the at least one vent comprises at least two vents, wherein each of the at least two vents are semi-elliptical, and wherein major axes of respective ones of the at least two vents are along respective sides of the membrane.

6. A microelectromechanical system (MEMS) acoustic sensor comprising:
    a substrate;
    a membrane situated parallel to the substrate; and
    at least one vent formed into the membrane, wherein a portion of the at least one vent is a curved opening in the membrane, wherein the at least one vent is disposed substantially along a side of the membrane, wherein each of the at least one vent has a first end and a second end that is opposite the first end, and wherein each of the at least one vent comprises respective substantially elliptical holes positioned at the first end and the second end.

7. The MEMS acoustic sensor of claim 6, wherein a diameter of each of the substantially elliptical holes is larger than a width of each of the at least one vent.

8. The MEMS acoustic sensor of claim 1, further comprising:
    a backplate situated parallel to the membrane that covers at least a portion of the membrane.

9. The MEMS acoustic sensor of claim 8, wherein the substrate is positioned between the backplate and the membrane.

10. The MEMS acoustic sensor of claim 8, wherein the backplate is positioned between the substrate and the membrane.

11. A microelectromechanical system (MEMS) acoustic sensor comprising:
    a substrate;
    a membrane situated parallel to the substrate; and
    at least one vent formed into the membrane, wherein a portion of the at least one vent is a curved opening in the membrane, wherein the at least one vent is disposed substantially along a side of the membrane, wherein the membrane comprises a sensing area, the sensing area comprising a polysilicon layer positioned between two silicon nitride layers, wherein the membrane further comprises a non-sensing area, and wherein the sensing area and the non-sensing area are isolated by at least one of the two silicon nitride layers.

12. The MEMS acoustic sensor of claim 11, wherein at least a portion of a perimeter of the sensing area has a curved shape.

13. A microelectromechanical system (MEMS) acoustic sensor comprising:
    a substrate; and
    a membrane of a polygonal shape attached to the substrate at respective edges of the membrane, wherein the membrane has at least one vent, the at least one vent being a curved opening in the membrane, wherein at least a portion of the at least one vent is semi-elliptical, and wherein a major axis of the at least one vent is along the side of the membrane.

14. The MEMS acoustic sensor of claim 13, wherein the polygonal shape of the membrane is selected from a group of shapes comprising a quadrilateral, a hexagon, and an octagon.

15. The MEMS acoustic sensor of claim 13, wherein the at least one vent comprises a plurality of vents, and wherein respective ones of the plurality of vents are positioned along alternating ones of the sides of the membrane.

16. The MEMS acoustic sensor of claim 13, wherein each of the at least one vent has a first end and a second end that is opposite the first end, and wherein each of the at least one vent comprises respective substantially elliptical holes positioned at the first end and the second end.

17. The MEMS acoustic sensor of claim 16, wherein a diameter of each of the substantially elliptical holes is larger than a width of each of the at least one vent.

18. A membrane for a microelectromechanical system (MEMS) microphone, comprising:
    a first membrane portion configured to deflect in response to receiving an acoustic signal;
    a second membrane portion configured to be attached to a substrate; and
    a third membrane portion having at least one vent, wherein each of the at least one vent is a curved through hole in the third membrane portion, and wherein each of the at least one vent has respective substantially elliptical holes positioned at respective ends of each of the at least one vent.

19. The membrane of claim 18, wherein respective ones of the at least one vent are at least partially semi-elliptical, and wherein a major axis of the respective ones of the at least one vent are along respective sides of the membrane.

20. The membrane of claim 18, wherein a diameter of each of the substantially elliptical holes is larger than a width of each of the at least one vent.

\* \* \* \* \*